United States Patent
Guo et al.

(10) Patent No.: US 12,362,168 B2
(45) Date of Patent: Jul. 15, 2025

(54) SOLVENT ANNEALING OF AN ORGANIC PLANARIZATION LAYER

(71) Applicants: INTERNATIONAL BUSINESS MACHINES CORPORATION, Armonk, NY (US); SCREEN SPE USA LLC, Sunnyvale, CA (US)

(72) Inventors: Jing Guo, Niskayuna, NY (US); Wenyu Xu, Albany, NY (US); Indira Seshadri, Niskayuna, NY (US); Luciana Meli-Thompson, Albany, NY (US); Dustin Wayne Janes, Albany, NY (US); Jon Fayad, Ballston Lake, NY (US); Eric Evans, Saratoga, NY (US); Domenico DiPaola, Glasco, NY (US)

(73) Assignees: INTERNATIONAL BUSINESS MACHINES CORPORATION, Armonk, NY (US); SCREEN SPE USA LLC, Sunnyvale, CA (US)

(*) Notice: Subject to any disclaimer, the term of this patent is extended or adjusted under 35 U.S.C. 154(b) by 695 days.

(21) Appl. No.: 17/554,738

(22) Filed: Dec. 17, 2021

(65) Prior Publication Data

US 2023/0197437 A1 Jun. 22, 2023

(51) Int. Cl.
*H01L 21/02* (2006.01)
*G03F 7/16* (2006.01)
*H01L 23/31* (2006.01)

(52) U.S. Cl.
CPC ........ *H01L 21/02118* (2013.01); *G03F 7/162* (2013.01); *G03F 7/168* (2013.01); *H01L 21/02282* (2013.01); *H01L 23/3178* (2013.01)

(58) Field of Classification Search
CPC ......... H01L 21/02118; H01L 21/02282; G03F 7/162; G03F 7/168
See application file for complete search history.

(56) References Cited

U.S. PATENT DOCUMENTS

| 6,312,971 B1 | 11/2001 | Amundson et al. |
| 11,915,931 B2* | 2/2024 | Lee ........................ G03F 7/0751 |
| 2017/0025274 A1* | 1/2017 | Engelmann ......... B81C 1/00396 |
| 2020/0144061 A1* | 5/2020 | Mignot ..................... G03F 7/40 |
| 2021/0296117 A1* | 9/2021 | Yamamoto ........ H01L 21/31144 |

FOREIGN PATENT DOCUMENTS

WO  WO-2023244560 A1 * 12/2023 ........ H01L 21/02115

* cited by examiner

*Primary Examiner* — Amanda C. Walke
(74) *Attorney, Agent, or Firm* — Tutunjian & Bitetto, P.C.; Samuel Waldbaum

(57) ABSTRACT

A method for forming a planarization layer is provided that can include depositing an organic planarization layer on a deposition surface using a spin on deposition method; and treating the deposited organic planarization layer with a solvent anneal. In some embodiments, a vapor of solvent is passed over the deposited organic planarization layer to increase uniformity of the deposited organic planarization layer. The method may further include curing the deposited organic planarization layer with a thermal anneal.

11 Claims, 5 Drawing Sheets

SOLVENT ANNEALING OF AN ORGANIC PLANARIZATION LAYER

BACKGROUND

The present disclosure relates to the deposition of planarization layers used in processing of electrical devices, and more particularly to processing planarization layers deposited by spin on methods.

Organic planarization layers (OPL) are deposited using spin on methods. In some instances, in which the deposition surface is irregular, as in the case of high aspect ratio structures that are separated by a minimum pitch, as in the case of Fin-type semiconductor structures, the deposited layer may have a non-uniform upper surface. Additionally, voids may be formed in the deposited material layer between the adjacent high aspect ratio structures.

SUMMARY

In one aspect of the present disclosure, a method is provided for depositing a planarization layer. In one embodiment, forming the planarization layer may include depositing an organic planarization layer on a deposition surface using a spin on deposition method. The deposited organic planarization layer is then treated with a solvent anneal, wherein a vapor of solvent is passed over the deposited organic planarization layer to increase uniformity. After solvent annealing, the deposited organic planarization layer is cured with a thermal anneal.

In another aspect of the present disclosure, a system is provided for forming a planarization layer. In one embodiment, the system may include a spin on deposition stage to deposit an organic planarization layer. The system may further include a solvent vapor anneal chamber that is separate from the spin on deposition stage, wherein the solvent vapor anneal chamber includes a bubbler positioned within a solvent container the bubbler for introducing a carrier gas to the solvent container to produce a solvent vapor that is passed over the organic planarization layer. The solvent vapor is passed over the deposited organic planarization layer to increase uniformity. The system further includes a thermal curing chamber for annealing to crosslink the organic planarization layer.

In yet another aspect, an electrical device is provided in which the organic planarization layer of the device has been treated with a solvent annealing process to increase uniformity. The electrical device may include a plurality of fin structures having an aspect ratio greater than 10, and a pitch separating adjacent fin structures in the plurality of fin structures of 45 nm or less. The electrical device may further include an organic planarization layer (OPL) overlying the plurality of fin structures, wherein the organic planarization layer entirely fills a volume between the adjacent fin structures that is void free.

DETAILED DESCRIPTION OF PREFERRED EMBODIMENTS

Figure 1:
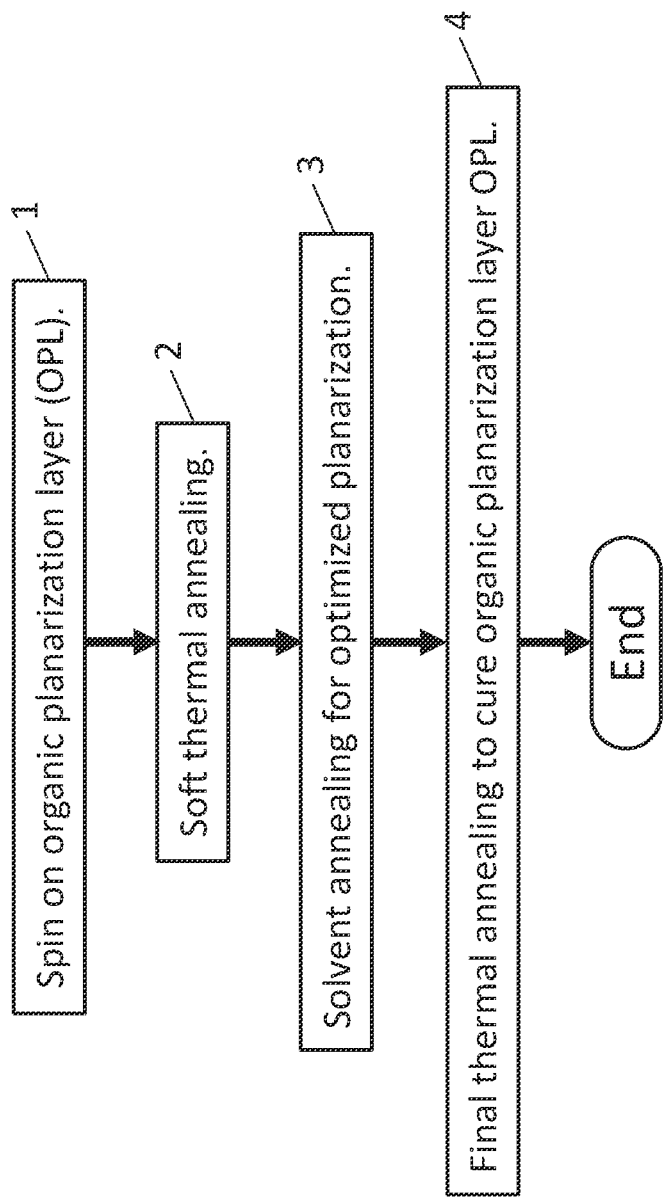
FIG. 1 is a flow chart of one embodiment of a method for forming an organic planarization layer, and applying solvent annealing to increase uniformity of the organic planarization layer.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present description. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Methods for depositing organic planarization layers (OPL) on irregular deposition surfaces may require multiple deposition and etch back process steps to provide uniformity and consistent fill properties. This can especially be the case when the deposition surface includes a plurality of high aspect ratio structures that are separated by a tight pitch, such as in the case of fin type semiconductor features on a supporting substrate. In some embodiments, the methods, systems and structures of the present disclosure can provide a method of depositing an organic planarization layer (OPL) layer using solvent annealing. The solvent annealing process may be employed prior to organic planarization layer (OPL) thermal annealing for the purposes of curing the material layer, in which the solvent annealing process can achieve optimized planarization. The solvent annealing process is a performed at low temperatures, only slightly above room temperature, which has a low impact on previously formed devices that can be present on the deposition surface before the OPL layer is deposited. The solvent employed during the solvent anneal increased the organic planarization layer (OPL) mobility, which enables further planarization after spin on wafer. The solvent choices are selected to have good wetting ability to spin materials. The solvent may include propylene glycol methyl ether acetate (PGMEA, 1-methoxy-2-propanol acetate), ethyl acetate, benzene, toluene, acetone, tetrahydrofuran and combinations thereof. The method and structures for organic planarization layer (OPL) planarization using solvent annealing are now described in more detail with reference to FIGS. 1-8.

FIG. 1 is a flow chart of one embodiment of a method for forming an organic planarization layer, and applying solvent annealing to increase uniformity of the organic planarization layer.

Block 1 of the method may include depositing the organic planarization layer (OPL) using spin on methods, such as spin on deposition. In one embodiment, the organic planarization layer (OPL) can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the organic planarization layer (OPL) can include a transparent organic polymer. The organic planarization layer (OPL) can be a standard $C_xH_y$ polymer.

In some examples, the organic planarization layer (OPL) may be polyacrylate resin, epoxy resin, phenol resin, polyamide resin, polyimide resin, unsaturated polyester resin, polyphenylenether resin, polyphenylenesulfide resin, or benzocyclobutene (BCB).

The organic planarization layer (OPL) is deposited using a spin coating process in which a solution of a material and a solvent that is spun at high speeds, in which the centripetal force and the surface tension of the liquid together create an even covering on the deposition surface. After any remaining solvent has evaporated, spin coating results in a thin film ranging from a few nanometers to a few microns in thickness.

Figure 2:
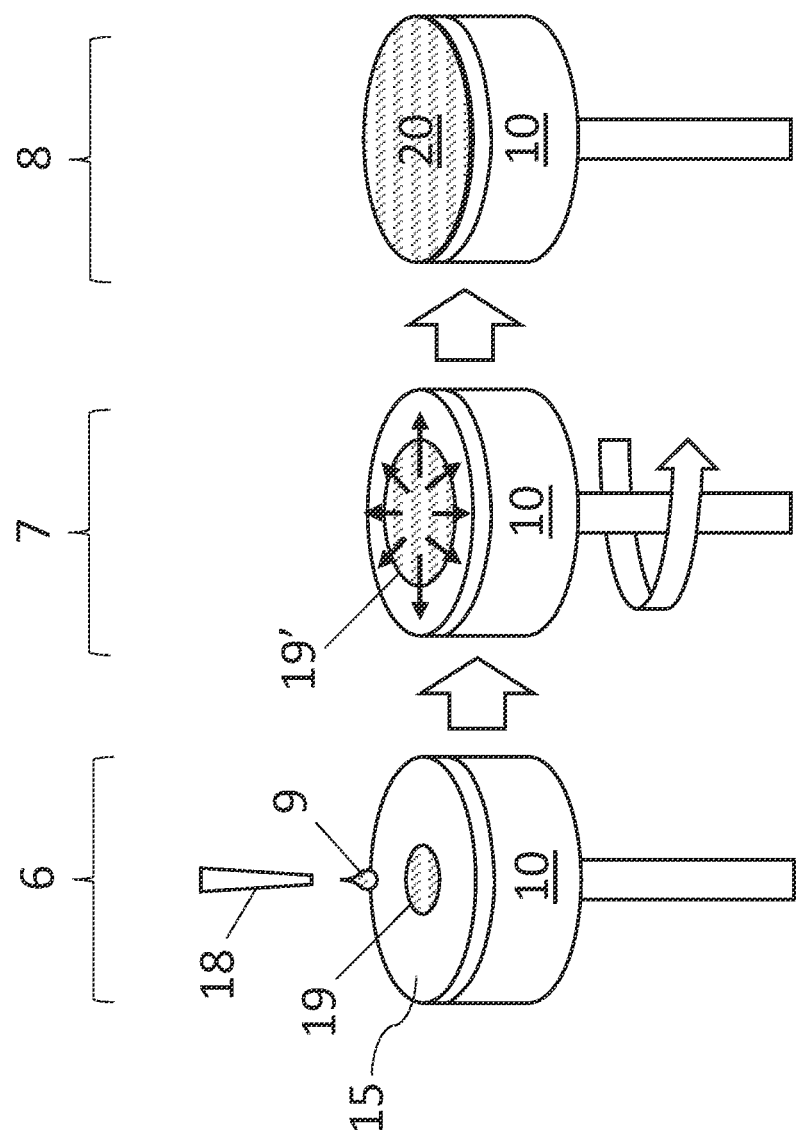
FIG. 2 is an illustration of a spin coating process flow, in accordance with one embodiment of the present disclosure.

FIG. 2 an illustration of one embodiment of spin coating for providing block 1 of the method recited in FIG. 1. Spin coaters are coating device that use centrifugal force of rotation to make thin and uniform coats on flat and smooth targets. The spin coater includes a rotating stage 10, and a target surface 15. The target surface 15 can be a surface of a semiconductor wafer that has been processed to include device features that provide an irregular deposition surface for the deposited organic planarization layer (OPL). Referring to stage 6 of the spin on process depicted in FIG. 1, in some embodiments, the coating fluid 9 is dropped at substantially a center of the target surface 15, and the rotating stage 10 starts to rotate at stage 7. In the initial step, the solution is cast onto the substrate (target surface 15), typically using a pipette 18. Whether the substrate (target surface 15) is already spinning (dynamic spin coating) or is spun after deposition (static spin coating), the centrifugal motion will spread the solution across the substrate (target surface 15). The substrate then reaches the desired rotation speed—either immediately or following a lower-speed spreading step. At this stage, most of the solution is expelled from the substrate. Initially, the fluid may be spinning at a different rate than the substrate, but eventually the rotation speeds will match up when drag balances rotational accelerations—leading to the fluid becoming level.

As the rotation accelerates, the centrifugal force is applied to the coating fluid, spreading the fluid over the entire surface to make a coating film 20, as depicted at stage 8. The rotation of the substrate at high speed (usually >10 rotations per second=600 rpm) means that the centripetal force combined with the surface tension of the solution pulls the liquid coating into an even covering. Spin coating generally involves the application of a thin film (a few nm to a few um) evenly across the surface of a substrate by coating (casting) a solution of the desired material in a solvent (an "ink") while it is rotating. During this time the solvent then evaporates to leave the desired material on the substrate in an even covering.

At stage 8, the rotation is discontinued, and fluid outflow stops, wherein coating thinning is dominated by evaporation of the solvent. The rate of solvent evaporation will depend the solvent volatility, vapor pressure, and ambient conditions.

The thickness of the film depends on the fluid viscosity, rotation speed of the target, rotation start acceleration, and ventilation, which affects drying speed.

Figure 3:
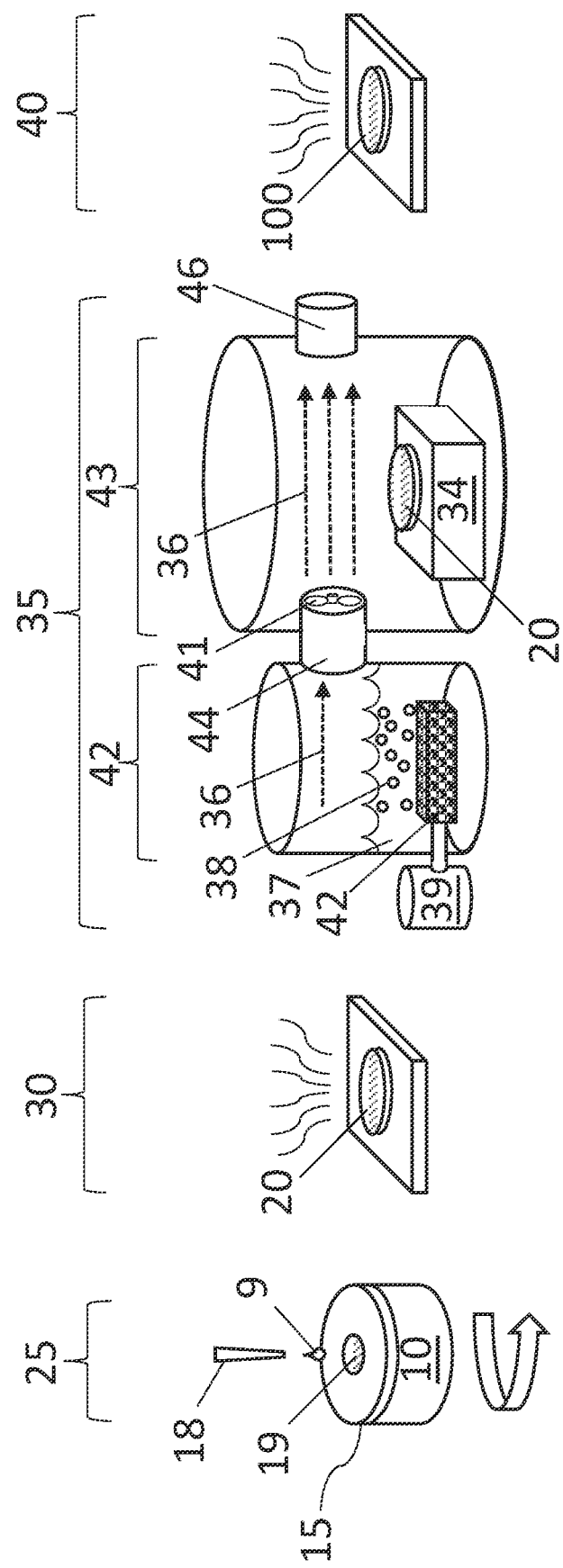
FIG. 3 is an illustration of a system for forming an organic planarization layer using spin on deposition and solvent annealing, in accordance with one embodiment of the present disclosure.

FIG. 3 illustrates one embodiment of a system for providing an organic planarization layer (OPL) using solvent annealing. The spin on deposition apparatus 25 may provide the first component of that system, which can be a track based system.

Figure 4:
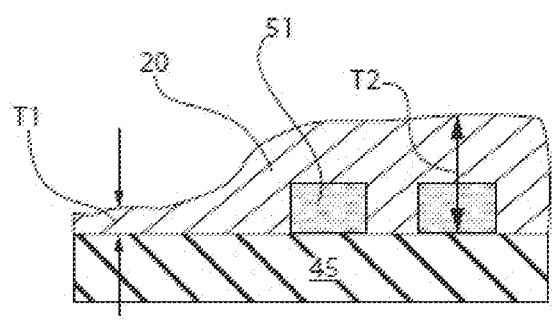
FIG. 4 is a side cross-sectional view depicting depositing an organic planarization layer (OPL) on an irregular deposition surface.

FIG. 4 illustrates one embodiment of an organic planarization layer 20 deposited on a semiconductor substrate 45 having device features 51 that produce an irregular surface. The device features 51 could be gate structures of transistors. e.g., field effect transistors, or could be the Fin-structure of Fin-type field effect transistors. Any device or structure employed in devices formed on the substrate 45 having a vertical projection can cause an irregular surface that can impact the uniformity of the deposited organic planarization layer. FIG. 4 illustrates one embodiment of an organic planarization layer (OPL) 20 that has been deposited on an irregular deposition surface, e.g., target surface 15, in which in the areas at which the device features 51 are not present the organic planarization layer 15 has a thickness T1, as measured from the upper surface of the substrate 45, that is less than the thickness T2, as measured from the upper surface of the substrate 45 in the portions of the deposition surface, e.g., target surface 15, that include the device features 51. In some embodiments, the combination of the increased surface of the portions of the target surface 15 that result from the device features 51, as well as the centrifugal force of the spin on deposition method causes the deposited organic planarization layer (OPL) 20 to build up on the raised portions of the irregular target surface 15.

Figure 6:
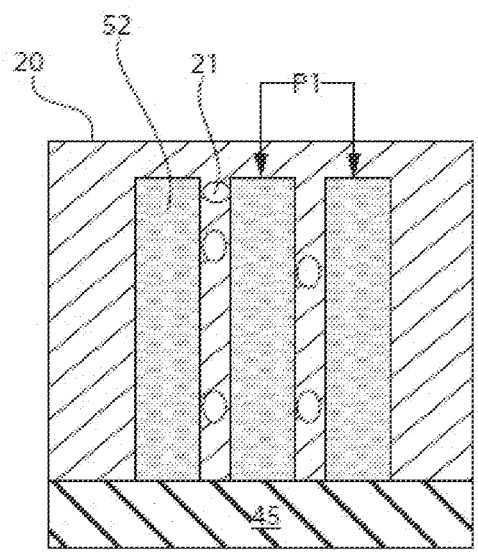
FIG. 6 is a side cross-sectional view depicting depositing an organic planarization layer (OPL) on a deposition surface including high aspect ratio structures of tight pitch, in which voids are formed between the adjacent structures.

FIG. 6 illustrates depositing an organic planarization layer (OPL) 20 on an irregular deposition surface, e.g., target surface 15, including high aspect ratio structures of a tight pitch P1, in which voids 21 are formed between the adjacent structures. In the embodiment, depicted in FIG. 6, the high aspect ratio structures may be fin structures 52. The fin structure 52 are vertically orientated semiconductor structures. For example, the fin structures 52 may be composed of a type IV semiconductor material, such as silicon (Si), or a type III-V semiconductor, such as gallium arsenide (GaAs). The pitch P1 is the center to center distance separating to repeating structure. In the case depicted in FIG. 6, the pitch P1 is the distance separating fin structures. The pitch P1 separating adjacent fin structures 52 may range from 35 nm to 45 nm. In another example, in which increased spacing is desired, the pitch P1 separating adjacent fin structures 52 may range from 30 nm to 40 nm. The aspect ratio of the fin structures 52 is the ratio of the height of the fin structure 52 to the width of the fin structure 52. Fin structures 52 can have aspect ratio's ranging from 5 to 50. In some embodiments, the aspect ratio of a fin structure 52 can range from 10 to 20.

In some embodiments, the centrifugal force of the spin on deposition method in combination of the narrow separation between the adjacent fin structures 51 having a tight pitch, and the height of the space between the tight pitch fin structures 51 causes the deposited organic planarization layer (OPL) 20 not entirely fill the space between the fin structures 51. More specifically, voids 21 can be formed in the organic planarization layer (OPL) 20 that is present within the space between the fin structures 51 of tight pitch and high aspect ratio, when the organic planarization layer (OPL) 20 is formed using spin on deposition, which partially results from the centrifugal force of the spin on deposition process.

Referring to FIG. 1, following deposition, the method can continue to block 2. At block 2, a soft thermal anneal may be performed. The term "soft" denotes that the temperature of the anneal does not cause the deposited organic planarization layer (OPL) 20 to cure, e.g., crosslink. The soft thermal anneal is an optional step, which may be performed to drive off by thermal means any additional solvent that was not removed by the centrifugal force of the spin on deposition method. The soft thermal anneal may be performed at a temperature ranging from 80° C. to 120° C. for a time period that can range from 30 seconds to 5 minutes. The soft thermal anneal may be performed at atmospheric pressure. e.g., 1 atm.

Referring to FIG. 3, in some embodiments, the soft thermal anneal may be performed by heating the deposited material on a hot plate 30 that is separate from the spin on deposition apparatus 25. The hot plate 30 may be provided by a flat surface having electrical heating elements engaged thereto. It is noted that the hot plate 30 is only one example of an anneal apparatus for performing the surface thermal anneal. Any anneal apparatus, e.g., furnace, stoves and/or forced heated air, may be employed to heat the deposited organic planarization layer (OPL) 20 for performing the soft thermal anneal, as described in block 2 of FIG. 1.

It is noted that the soft thermal anneal that is described with reference to block 2 of FIG. 1 and the hot plate 30 depicted in FIG. 3 is optional. Therefore, the soft thermal anneal may be omitted from the method that is described with reference to block 2 of FIG. 1, and the hot plate 30 may be omitted from the system depicted in FIG. 3.

Referring to FIG. 1, in a following process flow, the method can continued to block 3. Block 3 includes solvent annealing to optimize the deposited organic planarization layer (OPL). In some embodiments, the solvent annealing process provides an organic planarization layer (OPL) planarization layer. For example, the solvent annealing process applied to the organic planarization layer (OPL) 20 provides for a reflow, i.e., increased mobility, of the spin on deposited material to provide that the inconsistencies in the thickness of the organic planarization layer 20 be removed. More specifically, the reflow provides that a uninform upper surface be provided. i.e., a planarized upper surface. This is achieved without mechanical planarization methods, such as planarization and/or chemical mechanical planarization (CMP). The planarization of the organic planarization layer (OPL) layer is also achieved without etch processes, and without additional depositions. The uniform upper surface of the organic planarization layer 20 results from the solvent anneal process.

Figure 5:
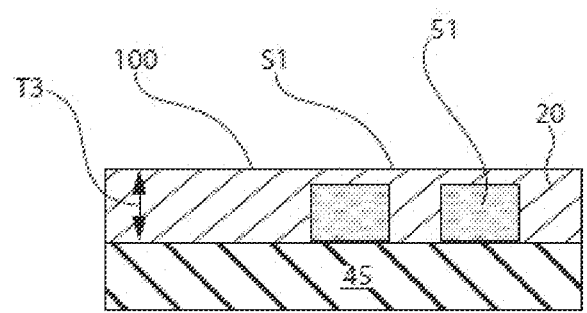
FIG. 5 is a side cross-sectional view depicting reflow of the deposited organic planarization layer (OPL) depicted in FIG. 4 during solvent annealing to provide a uniform upper surface.

A planar and uniform upper surface S1 for the solvent anneal treated organic planarization layer 100 is depicted in FIG. 5. One measurement of the uniformity of the upper surface is by measuring the thickness T3 of the organic planarization layer (OPL) 100 from the upper surface of the substrate 45. As illustrated in FIG. 5, for the entire width of the organic planarization layer 100, the thickness T3 of the layer as measured from the upper surface of the substrate 45 is substantially the same. The upper surface S1 of the solvent anneal treated organic planarization layer 100 is substantially free of divots and/or apexes. This is distinguished from the upper surface of the organic planarization layer 20 after deposition and without solvent anneal treatments, as depicted in FIG. 4. As illustrated in FIG. 4, there is variation in the thickness T1, T2 of the organic planarization layer (OPL) 20 across the width of the structure.

Referring to FIGS. 1 and 3, in some embodiments, the solvent used to increase organic planarization layer (OPL) mobility is selected from the group consisting of propylene glycol methyl ether acetate (PGMEA, 1-methoxy-2-propanol acetate), ethyl acetate, benzene, toluene, acetone, tetrahydrofuran and combinations thereof. It is noted that the above examples are provided for illustrative purposes only. Other solvents may also be suitable so long as having good wetting ability, e.g., a wetting ability similar to the above examples, to the spin on material, e.g., the composition of the organic planarization layer (OPL) 100. Solvent annealing may be performed under relatively low temperatures, e.g., slightly greater than room temperature, which has low impact to devices. Room temperature may range from 20° C. to 25° C. at substantially atmospheric pressure, 1 atm.

FIG. 3 illustrates one embodiment of a solvent anneal apparatus 3. A solvent vapor 36 may be obtained by vaporizing a portion of liquid solvent 37. In the present description, the word "solvent" when used alone is understood to refer to the liquid phase of the solvent while "vapor" is understood to refer to the gas phase of the solvent. The solvent vapor 36 produced by the solvent anneal apparatus diffuses into the organic planarization layer (OPL) 20, which increases the mobility of the organic planarization layer (OPL) 20 through the introduction of the solvent. In some embodiments, by increasing the mobility, a more uniform, e.g., planar, upper surface for the organic planarization layer 100 is provided, as the material redistributes.

Referring to FIG. 3 to provide the solvent vapor 36, an inert carrier gas 39 is pushed through a porous medium 42 that is submerged in a vessel containing the solvent 37, which is in liquid form. The solvent 37 can be selected from the group consisting of propylene glycol methyl ether acetate (PGMEA, 1-methoxy-2-propanol acetate), ethyl acetate, benzene, toluene, acetone, tetrahydrofuran and combinations thereof. The carrier gas may be nitrogen ($N_2$) or argon (Ar), however, any inert gas can be employed to provide the carrier gas including helium (He).

Still referring to FIG. 3, injecting the carrier gas 39 into the solvent 37, causes the carrier gas 39 to bubble 38 through the solvent 37. Bubbling the carrier gas 39 through the solvent 37 produces the solvent vapor 36 that evaporates from the solvent 37 into the bell area of the vessel 42 containing the solvent 37.

The vessel 42 in which the solvent vapor 36 is generated is connected to a chamber 43, in which the structure having the spin on deposited organic planarization layer (OPL) 20 is positioned to be treated by the solvent vapor 36 of the solvent anneal. The chamber 43 is sufficiently sealed to prevent undesirable leakage of solvent vapor 36 or other gases. The chamber 43 further comprises a gas outlet 46 for removal of gases from the chamber 43 and a gas inlet 44 for admission of gases to the chamber 46. For example, the outlet 46 and the inlet 44 can each comprise a valve.

In some embodiments, both the vessel 42 and the chamber 43 may each be provided with heating or cooling means for control of the temperatures of the organic planarization layer (OPL) 20 and the solvent 37. For example, the chamber 43 may include a hot plate 34. The hot plate 34 can maintain the temperature in the chamber 43 to ensure that the solvent vapor 36 does not condense on the interior surfaces of the chamber 43. In another embodiment, a portion of the walls of the chamber 210 is cooled or heated to control the temperature of the solvent vapor 36.

In some embodiments, the temperature of the solvent anneal is at slightly above room temperature. Room temperature is within a range of approximately 20° C. to 25° C. at atmospheric pressure, e.g., 1 atm. The temperature of the solvent anneal may range from 20° C. to 80° C. It is noted that the temperatures provided for the solvent anneal are provided for illustrative purposes only. In some embodiments, temperatures may be employed so long as the selected temperatures ensure that the solvent vapor 36 does not condensate on the sidewalls of the chamber.

The solvent vapor 36 is passed over the organic planarization layer (OPL) 20 within the chamber 43, which treats the organic planarization layer (OPL) 20 with the solvent 37. In some embodiments, one or more fans 41 may be present within the solvent anneal apparatus 35 for distributing vapor 36 within the chamber 43. In some embodiments, the fans 41 can force the solvent vapor 36 to be blow into contact with the organic planarization layer (OPL) 20 to provide the planarized organic planarization layer (OPL) 100.

It is noted that the solvent anneal apparatus depicted in FIG. 3 is only one embodiment of the present disclosure. Other configurations for the solvent anneal apparatus have also been contemplated that are within the scope of the embodiments described herein. For example, both the vessel 42 and the chamber 43 may be housed within the same housing. In some embodiments, it is not necessary that the vessel 42 and the chamber 43 be separated from one another.

The solvent 37 from the solvent vapor 36 is absorbed by the organic planarization layer (OPL) 20, which increases the mobility of the organic planarization layer (OPL) 20. The increase in the mobility of the material of the organic planarization layer (OPL) 20 converts the structure having a non-uniform upper surface, as depicted in FIG. 4, to a planarized layer having a uniform thickness organic planarization layer 100, as depicted in FIG. 5.

Figure 7:
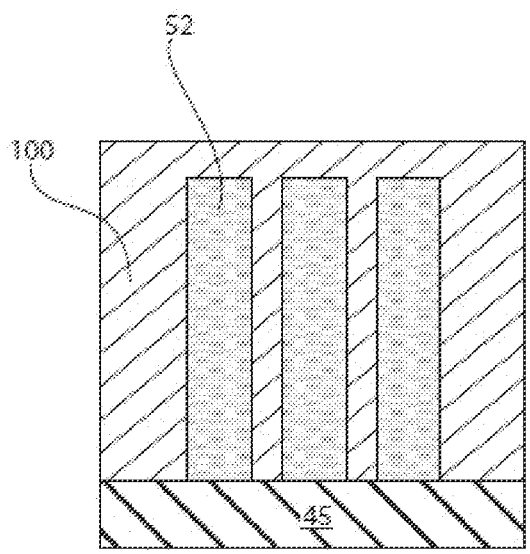
FIG. 7 is a side cross-sectional view depicting reflow of the deposited organic planarization layer (OPL) depicted in FIG. 6 during solvent annealing to remove the voids that were present between the adjacent structures.

Additionally, the increase in mobility that is introduced to the organic planarization layer (OPL) 20 by the solvent vapor 36 also facilitates filling voids 21 that are present between high aspect ratio tight pitch fin structures 52, as illustrated by the comparison of FIGS. 6 and 7. FIG. 6 illustrates a structure including a plurality of high aspect ratio tight pitch fin structures 5 following deposition of the organic planarization layer 20 with spin on deposition, as described in block 1 of FIG. 1. As described above, due to the high aspect ratio of the fin structures 52 and the tight pitch P1, when the spin on deposition apparatus 25 deposits the OPL layer onto the deposition surface, the combination of the irregular surface (tight pitch and high aspect ratio structures) and the centrifugal force of the deposition method results in the deposited material failing to full the entirety of the space between the fins 52. More specifically, voids 21 are formed.

The solvent anneal described in block 3 of FIG. 1 increase the mobility of the material for the deposited organic planarization layer 20. More specifically, the solvent anneal introduces the solvent vapor 36 to the deposited organic planarization layer 20. The solvent of the solvent vapor 36 is absorbed by the deposited organic planarization layer 20, wherein the solvent absorbed increases mobility of the material, which in turn causes the voids 21 to be filled during a reflow of the deposited material. This provides not only a planarized upper surface, as described above with reference to FIGS. 4 and 5, but causes the organic planarization layer material to completely fill the space (e.g., provides a void less fill) between the adjacent fin structures 52 for the solvent anneal treated organic planarization layer 100. The entirety of the height of the space between adjacently positioned fin structures 52 may be completely filled with the material of the organic planarization layer (OPL following the solvent anneal process.

Referring to FIG. 1, in a following step, a thermal anneal may be applied after the solvent anneal at block 4. The thermal anneal at block 4 may be at a temperature to cure. e.g., harden, the solvent anneal treated organic planarization layer (OPL) 100. In some embodiments, curing. e.g., to harden, the solvent anneal treated organic planarization (OPL) layer 100 may be heating the layer to a temperature above the crosslinking temperature for the polymeric composition of the organic planarization layer (OPL) 100. In some embodiments, the polymeric composition may have crosslinking characteristics that provide for both a low temperature crosslinking temperature and a high temperature crosslinking temperature.

In some embodiments, the temperature for thermal anneal at block 4 of the method depicted in FIG. 1 may be greater than 200° C. at atmospheric pressure, e.g., 1 atm. In some embodiments, the thermal anneal process to cure, e.g., crosslink, the material of the organic planarization layer may range from 200° C. to 350° C. In one example, the thermal anneal process at block 4 of the method depicted in FIG. 1 may include a dual back anneal process. The first anneal stage for the dual bake process may include a first temperature ranging front 240° to 260° C. and a second temperature ranging from 330° C. to 350° C.

Referring to FIG. 3, in some embodiments, the thermal anneal is performed to harden the organic planarization layer 100 at block 4 of FIG. 1 may be performed by heating the deposited material on a hot plate 40 that is separate from the spin on deposition apparatus 25 and the solvent anneal apparatus 35. The hot plate 40 may be provided by a flat surface having electrical heating elements engaged thereto. It is noted that the hot plate 40 is only one example of an anneal apparatus for performing the surface thermal anneal. Any anneal apparatus. e.g., furnace, stoves and/or forced heated air, may be employed to heat the solvent anneal treated organic planarization layer (OPL) 100 for performing the thermal anneal, as described in block 4 of FIG. 1.

The different stages of the system depicted in FIG. 3 may be track mounted.

Figure 8:
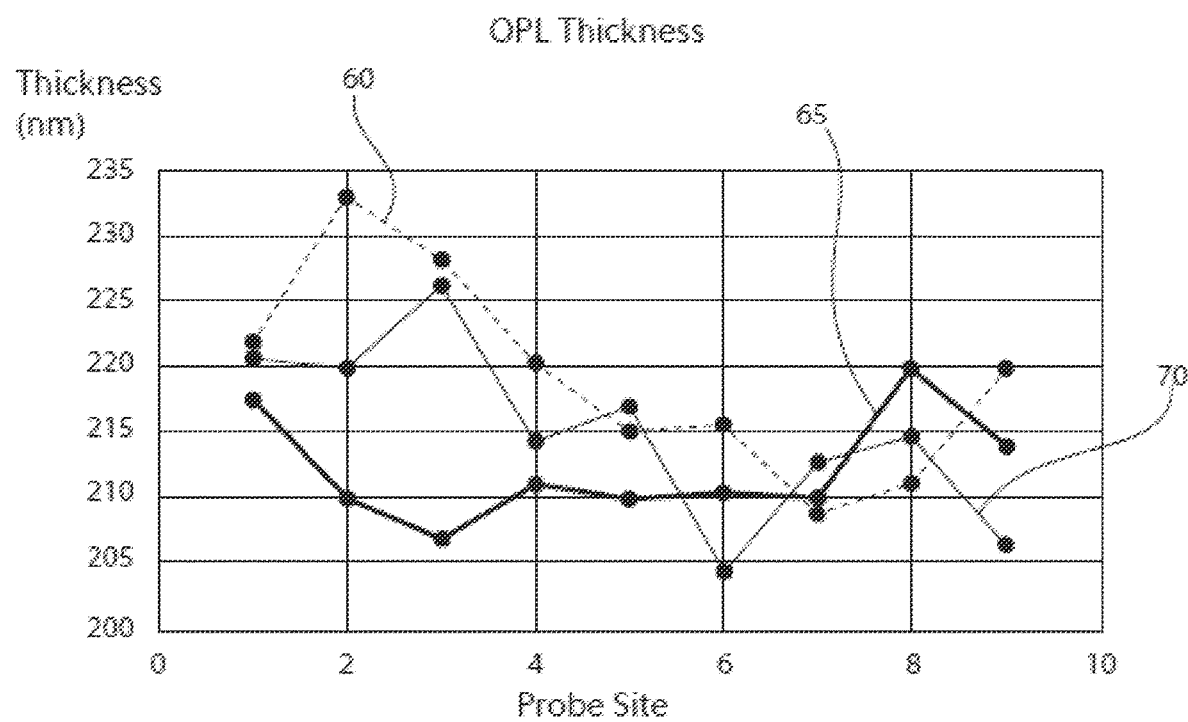
FIG. 8 is a plot illustrating variations of thicknesses across a spin deposited organic planarization layer (OPL) for samples that have been treated with solvent annealing in comparison to samples that were not treated to solvent annealing.

FIG. 8 is a plot illustrating variations of thicknesses across a spin deposited organic planarization layer (OPL) for samples that have been treated with solvent annealing in comparison to samples that were not treated to solvent annealing. Plot line having reference number 60 is a measurement of the thickness of an organic planarization layer that is not treated with a solvent anneal process. The thickness measurements plotted where measured from nine different points of the layer. The process for depositing the organic planarization layer that was plotted in the plot having reference number 60 was deposited using a spin on deposition process, and was cured with a two bake annealing process, in which a first bake was performed at a temperature of 250° C. and a second bake was performed at a temperature of 340° C. Plot line 60 is a comparative example.

Plot line 65 is a plot of thicknesses measured from an organic planarization player deposited using spin on deposition and treated with a solvent anneal process similar to the solvent anneal process described in block 3 of the method depicted in FIG. 1. The organic planarization layer that provided the data plotted in plot line 65 was formed using a processes sequence that includes a spin coating deposition process followed by a solvent anneal consistent with the description of the solvent anneal described in block 3 of FIG. 1. Following the solvent anneal, the solvent anneal treated organic planarization layer was cured with a two bake annealing process. The first bake of the cure process for the organic planarization layer that provided plot line 65 was performed at a temperature of 250° C. and a second bake of the cure process for the organic planarization layer that provided plot line 65 was performed at a temperature of 340° C.

Plot line 70 is a plot of thicknesses measured from an organic planarization player deposited using spin on deposition and treated with a soft anneal followed by a solvent anneal process similar to the solvent anneal process described in block 3 of the method depicted in FIG. 1. The organic planarization layer that provided the data plotted in plot line 70 was formed using a processes sequence that includes a spin coating deposition process followed by a soft anneal consistent with the anneal described in block 2 of the methods described with reference to FIG. 1. Following the soft anneal, the organic planarization providing the data for plot line 70 was treated with a solvent anneal consistent with the description of the solvent anneal described in block 3 of FIG. 1. Following the solvent anneal, the solvent anneal treated organic planarization layer was cured with a two bake annealing process. The first bake of the cure process for the organic planarization layer that provided plot line 70 was performed at a temperature of 250° C., and a second bake of the cure process for the organic planarization layer that provided plot line 70 was performed at a temperature of 340° C.

Comparing the plot lines illustrative of the thickness across the organic planarization layers that were treated with solvent annealing. e.g., plot lines 65 and 70, with the plot line of the comparative example e.g., plot line 60, which was not treated with solvent annealing; illustrates that the spin on deposited layers that were treated with the solvent anneal process have a significantly smaller difference in thickness across the layer than the layer that was not treated with solvent annealing.

It is to be understood that aspects of the present invention will be described in terms of a given illustrative architecture; however, other architectures, structures, substrate materials and process features, and steps can be varied within the scope of aspects of the present invention.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is to be appreciated that the use of any of the following "/", "and/or", and "at least one of" for example, in the cases of "A/B". "A and/or B" and "at least one of A and B", is intended to encompass the selection of the first listed option (A) only, or the selection of the second listed option (B) only, or the selection of both options (A and B). As a further example, in the cases of "A, B. and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including." when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a structure and method for solvent annealing of an organic planarization layer, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a planarization layer comprising:
   depositing an organic planarization layer on a deposition surface using a spin on deposition method;
   treating the deposited organic planarization layer with a solvent anneal, wherein a vapor of solvent is passed over the deposited organic planarization layer to increase uniformity of the deposited organic planarization layer; and
   curing the deposited organic planarization layer with a thermal anneal.

2. The method of claim 1, wherein a composition of the organic planarization layer is a $C_xH_y$ polymer.

3. The method of claim 1, wherein the organic planarization layer has a composition selected from the group consisting of polyacrylate resin, epoxy resin, phenol resin, polyamide resin, polyimide resin, unsaturated polyester resin, polyphenylenether resin, polyphenylenesulfide resin, benzocyclobutene (BCB) and combinations thereof.

4. The method of claim 1 further comprising an anneal to remove solvent from the organic planarization layer before the solvent anneal.

5. The method of claim 1, wherein the anneal to remove the solvent from the organic planarization layer before the solvent annal has an anneal temperature ranging from 80° C. to 180° C.

6. The method of claim 1, wherein the solvent anneal comprises producing the vapor of solvent by passing a carrier gas through a liquid solvent, and passing the vapor of solvent over the deposited organic planarization layer.

7. The method of claim 6, wherein the liquid solvent has a solution selected from the group consisting of propylene glycol methyl ether acetate (PGMEA, I-methoxy-2-propanol acetate), ethyl acetate, benzene, toluene, acetone, tetrahydrofuran and combinations thereof.

8. The method of claim 6, wherein the carrier gas has a composition selected from the group consisting of nitrogen ($N_2$), argon (Ar), helium (He) and combinations thereof.

9. The method of claim 1, wherein a temperature of the solvent anneal ranges from 20° C. to 80° C.

10. The method of claim 1, wherein the curing of the deposited organic planarization layer with the thermal anneal comprises a thermal anneal temperature that is greater than 200° C.

11. The method of claim 1, wherein the solvent from the vapor of solvent is absorbed by the organic planarization layer and increases mobility of a material of the organic planarization layer.

* * * * *